United States Patent
Aigner et al.

(10) Patent No.: US 12,206,238 B2
(45) Date of Patent: Jan. 21, 2025

(54) METHOD AND DEVICE FOR COMPENSATING A LINE FAULT OCCURRING ON A THREE-PHASE POWER SUPPLY NETWORK

(71) Applicant: HSP HOCHSPANNUNGSGERATE GMBH, Munich (DE)

(72) Inventors: Florian Aigner, Schwertberg (AT); Thomas Schinerl, Hörsching (AT); Hannes Schuster, Marchtrenk (AT)

(73) Assignee: HSP Hochspannungsgeräte GmbH, Troisdorf (DE)

( * ) Notice: Subject to any disclaimer, the term of this patent is extended or adjusted under 35 U.S.C. 154(b) by 252 days.

(21) Appl. No.: 17/923,972

(22) PCT Filed: May 7, 2021

(86) PCT No.: PCT/EP2021/062162
§ 371 (c)(1),
(2) Date: Nov. 8, 2022

(87) PCT Pub. No.: WO2021/224462
PCT Pub. Date: Nov. 11, 2021

(65) Prior Publication Data
US 2023/0187929 A1 Jun. 15, 2023

(30) Foreign Application Priority Data
May 8, 2020 (EP) .................................. 20173634

(51) Int. Cl.
*H02H 9/08* (2006.01)
*G01R 31/08* (2020.01)

(52) U.S. Cl.
CPC ............. *H02H 9/08* (2013.01); *G01R 31/086* (2013.01)

(58) Field of Classification Search
CPC ................................ H02H 9/08; G01R 31/086
See application file for complete search history.

(56) References Cited

U.S. PATENT DOCUMENTS

| | | | | |
|---|---|---|---|---|
| 5,699,219 A | * | 12/1997 | Arita ......................... | H02H 9/08 361/58 |
| 2015/0168481 A1 | * | 6/2015 | Hackl ..................... | G01R 27/18 324/551 |

(Continued)

FOREIGN PATENT DOCUMENTS

| | | |
|---|---|---|
| DE | 102016110420 A1 | 12/2017 |
| WO | 0215355 A2 | 2/2002 |

*Primary Examiner* — Scott Bauer
(74) *Attorney, Agent, or Firm* — Laurence A. Greenberg; Werner H. Stemer; Ralph E. Locher (57) ABSTRACT

A device for compensating a line fault occurring on a three-phase power supply grid includes a transformer with a neutral point which is designed to generate a network voltage and thus a neutral-point displacement voltage. A measurement and control device is configured to detect the network voltage or the neutral-point displacement voltage and on that basis to identify an occurring line fault and to determine a control variable for compensating the line fault. A converter circuit is configured to generate a control current from the control variable and to feed in the control current at the neutral point of the transformer to compensate the line fault. The measurement and control device is also configured to determine a boost line value, and on that basis to determine a boost function, to generate a corresponding boost current, and to feed same in at the neutral point of the transformer.

15 Claims, 7 Drawing Sheets

(56) References Cited

U.S. PATENT DOCUMENTS

2016/0061873 A1\* 3/2016 Liu ..................... G01R 31/088
                                                          702/59
2021/0075210 A1\* 3/2021 Wahlroos ............... H02H 3/165
2021/0270885 A1\* 9/2021 Yang ..................... G01R 27/18

\* cited by examiner

METHOD AND DEVICE FOR COMPENSATING A LINE FAULT OCCURRING ON A THREE-PHASE POWER SUPPLY NETWORK

FIELD AND BACKGROUND OF THE INVENTION

The invention relates to a method and a device for compensating a line fault occurring on a three-phase power supply network, comprising a transformer with a neutral point, which is designed to generate a network voltage and thereby a neutral-point displacement voltage, and a measurement and control device is also provided which is designed to detect the network voltage or the displacement voltage and to identify an occurring line fault and to determine a control variable to compensate for the line fault, and a converter circuit is also provided which is designed to generate a control current from the control variable and to feed in the control current at the neutral point of the transformer in order to compensate for the line fault.

It is known that a line fault can be detected, for example, by monitoring the network voltages of the individual phases, and if a specified limit value is undershot, such as a network voltage in one phase falling below 50% of the normal network voltage in normal operation, or the network voltage exceeding 100% of the normal network voltage.

In addition, a line fault can be detected by monitoring the displacement voltage at the neutral point of the three-phase network if a specified limit value is exceeded.

In addition, a line fault can also be detected by determining a variable derived from the network voltage or displacement voltage, such as a fault resistance in the relevant phase of the three-phase network. It is clear that in the event of a line fault, the associated phase can also be determined. Low-resistance ground faults are generally referred to as ground faults with a resistance to earth of less than 5 kΩ, in particular those with a resistance to earth of less than 1 kΩ.

High-resistance ground faults can occur, for example, when a fallen tree touches a transmission line (40 to 100 kΩ), a conductor cable falls on dry sand, dry rocks, snow or ice after a cable breakage, or in the event of a return cable breakage, in which a conductor cable returning from the consumer approaches the ground with low resistance or even touches the ground.

In practice, it is possible that such ground faults in remote locations can cause forest fires and result in serious damage.

In compensated networks, an arc suppression coil (Petersen coil) is used to compensate capacitive ground fault currents from output circuits with an inductive current.

Nevertheless, even with the ideal setting of the arc suppression coil, the active component in the fault current caused by the network losses cannot be compensated.

SUMMARY OF THE INVENTION

It is therefore an object of the invention to compensate for fault currents more quickly and more efficiently after a corresponding fault event.

The object is achieved by a device of the type mentioned above, by the measurement and control device being also configured to determine a boost conductance from which to determine a boost function, to generate a corresponding boost current and to feed in the boost current at the neutral point of the transformer.

In other words, the control variable also comprises a boost function, which is based on a boost conductance that is determined in advance by the measurement and control device.

The invention results in a compensation current being fed into the neutral point of a distribution transformer in the sense of an active residual current compensation, which counteracts and reduces the fault current.

The boost function enables the compensation of a fault current to be accomplished much more quickly so that relevant requirements of network operators can be met.

The fault resistance can be determined by the position of the neutral point in the three-phase medium- or high-voltage network.

In a refinement of the invention it is provided that the boost function has a maximum of 20%, preferably 50%, particularly preferably 100% or 200% of the magnitude of the maximum of the RMS value of the control variable.

This allows the compensation to be accelerated and made more efficient.

In a refinement of the invention, it is provided that the maximum of the RMS value of the boost function occurs within a maximum of 25 ms, preferably a maximum of 20 ms, and the boost function decays to a maximum of 10% of the magnitude of the maximum of the RMS value of the control variable, preferably of the static current, within a maximum of 120 ms, preferably a maximum of 35 ms.

This allows the compensation to be carried out more efficiently and saves power by limiting the time required to generate the boost function.

The object according to the invention is also achieved by means of a corresponding method. The invention is explained hereafter in more detail by means of an exemplary embodiment shown in the enclosed drawings.

DETAILED DESCRIPTION OF THE INVENTION

Figure 1:
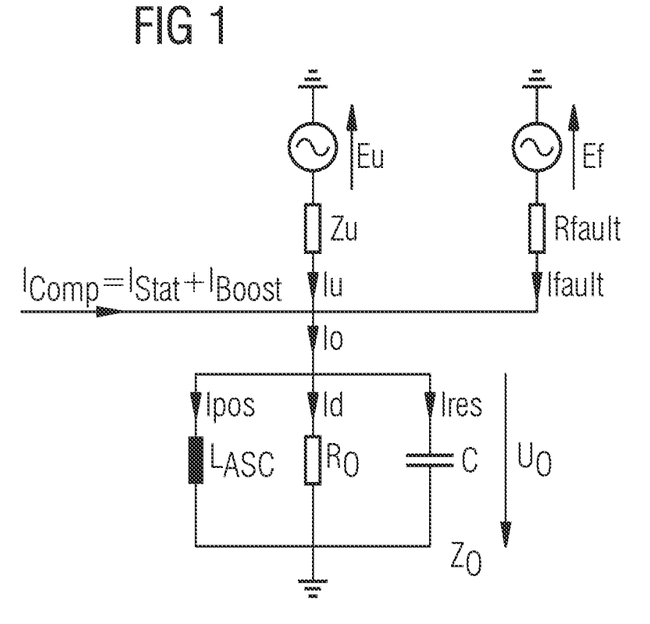
FIG. 1 shows a simplified null equivalent circuit diagram of a three-phase system.
Figure 2:
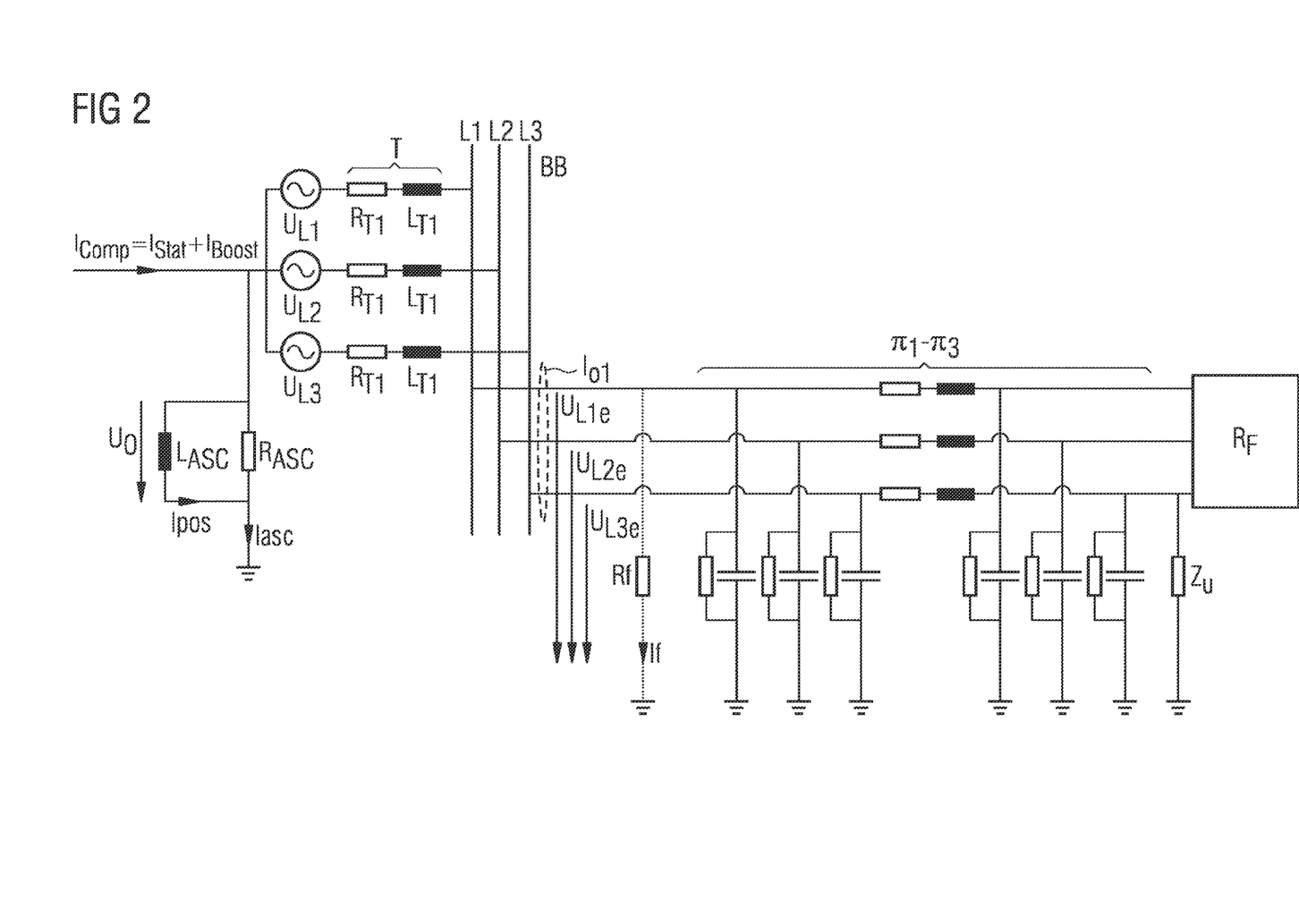
FIG. 2 shows an equivalent circuit diagram of a three-phase system for the example of FIG. 1.

FIG. 1 shows an exemplary embodiment of the invention with a simplified null equivalent circuit diagram of a three-phase network in the presence of a ground fault present on one phase, FIG. 2 shows a corresponding equivalent circuit diagram of a three-phase system with an output circuit.

Of a three-phase transformer T with the phases in a star connection, only the secondary side is shown in the figures.

The ground fault can be described by a driving fault voltage $E_f$ and a fault resistance $R_f$.

Furthermore, a network asymmetry is illustrated, which is formed mainly by different conductor—earth capacitances of the three phases. In the null equivalent circuit diagram, the unbalance current $I_u$ representing this unbalance is represented via the driving unbalance voltage $E_u$ and the unbalance impedance $Z_u$.

The driving fault voltage $E_f$ generates a fault current $I_f$ through a fault resistance, which can be formed by the ground fault.

To compensate for the capacitive fault current $I_f$ due to the ground fault, the neutral point of the network is earthed by means of an arc suppression coil $L_{ASC}$ (Petersen coil).

The network impedance $Z_0$ shown in the equivalent circuit diagram is formed by the parallel connection of an ohmic equivalent resistance $R_0$ for the entire network losses, including the losses of the arc suppression coil $L_{ASC}$, the network capacitance C (line capacitance) and the inductance of the arc suppression coil.

The equivalent resistance $R_0$ determines a damping current ID.

The impedance of the arc suppression coil LASC and thus the level of an inductive compensation current can be changed directly by adjusting the air gap in the iron core of the arc suppression coil, or the secondary side of the arc suppression coil LASC is wired to an inductance, a capacitor or a defined current supply, and/or the neutral point or one of the three phases can be wired with an ohmic resistor, an inductor, a capacitor or a defined current supply. Such measures and/or devices are known to the person skilled in the art, so they do not need to be explained or described in more detail.

The disadvantage of a "static" compensation in the prior art can be seen here.

The coil position can be determined by measuring the position using a potentiometer. This results in a coil current $I_{pos}$.

The tuning of the arc suppression coil $L_{ASC}$ takes place during the normal operation of the network (fault-free network condition), wherein the arc suppression coil $L_{ASC}$ is adjusted such that the inductive current through the arc suppression coil $L_{ASC}$ is the same as the capacitive current through the line capacitance (resonance current $I_{res}$).

In practice, however, for an arc-suppressed network without active residual current compensation in normal operation, a slight overcompensation or undercompensation can be set. This can be achieved by setting a current $I_{pos}$, which depends on the position of the plunger of the arc suppression coil.

With active residual current compensation, it may be appropriate to tune exactly to a resonance ($I_{pos}=I_{res}$).

With an exact tuning, the network impedance $Z_0=R_0$, which means that a maximum of the impedance of the parallel resonant circuit ($L_{ASC}$, $R_0$, C) is present, and the current through the fault location is minimal without residual current compensation.

Even with exact tuning, a complete compensation of the fault current is not possible with the arc suppression coil alone, since ohmic losses cannot be compensated by the arrangement.

These losses can occur by means of active residual current compensation, i.e. active current infeed with a compensation current $I_{comp}(t)$.

The compensation current $I_{comp}(t)$ is composed of a static current $I_{Stat}(t)$ and a boost current $I_{Boost}(t)$:

$$I_{Comp}(t)=I_{Start}(t)+I_{Boost}(t)$$

The static current $I_{Stat}(t)$ is determined during the tuning process in normal operation. All parameters of the simplified null equivalent circuit are determined.

In this way, in the event of a ground fault in phase $L_1$, $L_2$ or $L_3$, the infeed current can be determined for complete compensation of the fault current.

A complex displacement voltage $U_0$ occurs across the arc suppression impedance $Z_0$ and a displacement current $I_0$ flows through the network impedance $Z_0$.

The unbalance current $I_u$, the fault current If and the compensation or displacement current $I_0$ flow together at the neutral point of the three-phase network.

Figure 6:
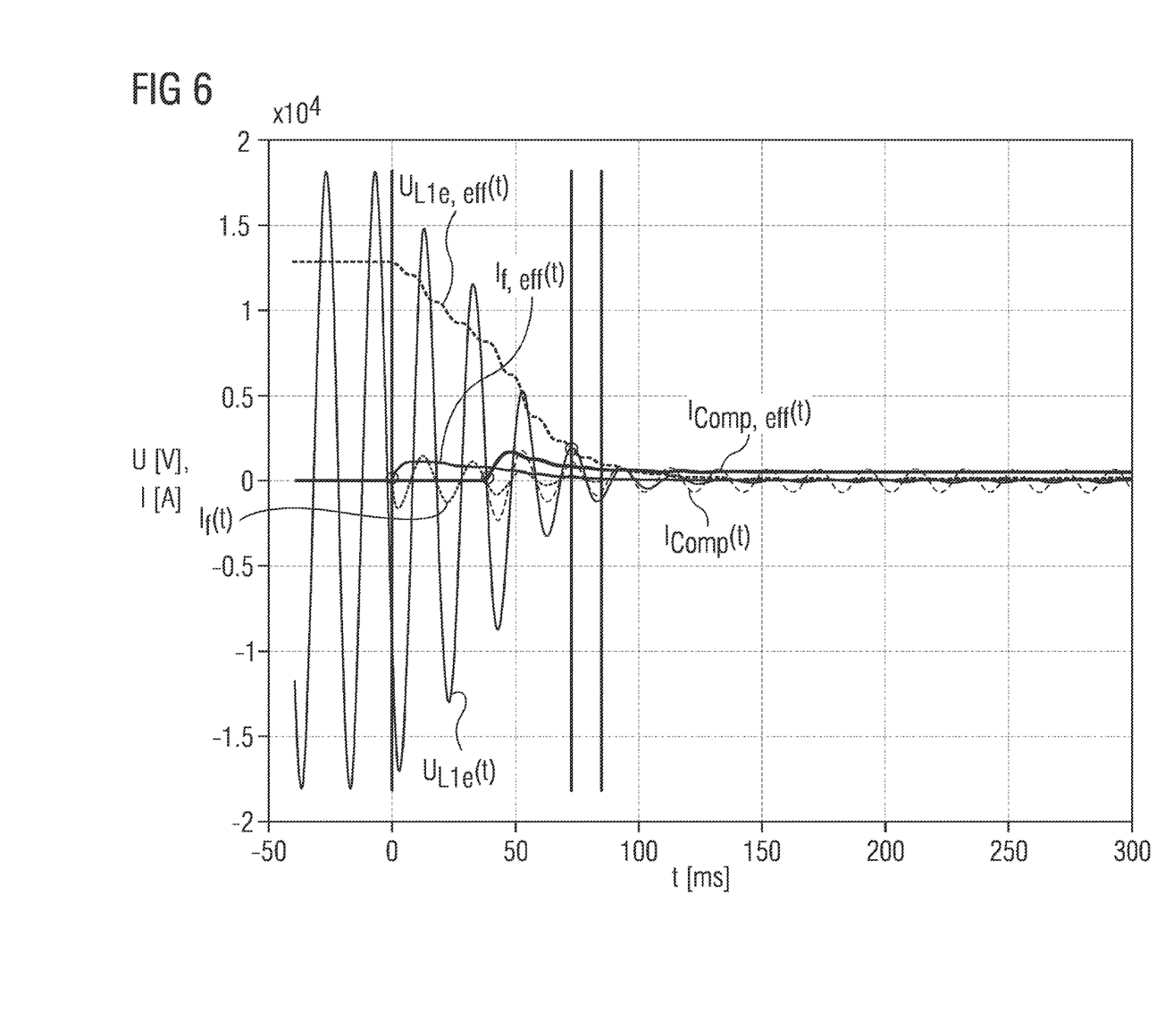
FIG. 6-8 shows examples of current and voltage waveforms with boost function.

In addition, the boost current $I_{Boost}(t)$ is fed in at the star point by a converter circuit, as in FIG. 6, for example, which can be determined by the following relationship:

$$I_{Boost}(t) = \frac{U_{LXE}(t)}{R_{Boost}(t)} = U_{Lxe}(t) \cdot Y_{Boost}(t)$$

For example, the boost conductance $Y_{Boost}$ can be set such that it limits a maximum current that the converter circuit used can still support.

The boost current $I_{Boost}(t)$ can be a current that is proportional to the faulty phase—ground voltage and therefore also decreases with decreasing voltage $U_{Lxe}(t)$, with x=1, 2, 3.

Alternatively, the compensation current could be temporarily doubled, for example.

The boost conductance $Y_{Boost}$ can be constant for a selected time range, such as 20 ms, 40 ms or 120 ms. In general, however, this is not a requirement and the boost conductance $Y_{Boost}(t)$ can therefore also be time-variant.

The compensation according to the invention takes place in three steps:
1. Basic compensation in the arc-suppressed network: capacitive conductor currents are compensated in the arc-suppressed network by an inductive current using a Petersen coil.
   The network is tuned in a fault-free state, wherein the inductive current corresponds to the capacitive zero current of the network at the optimal setting of the Petersen coil.
   In the case of a single-pole ground fault, with this measure only an active current would now flow through the fault location, which in many cases is sufficient to extinguish a ground fault, for example due to an arc.
   In the event of overcompensation ($I_{pos}>I_{res}$) or undercompensation ($I_{pos}<I_{res}$), an inductive or capacitive reactive current would occur in the fault current $I_f$ in addition to the active component.
   The active component of the fault current $I_f$ cannot be compensated by the "passive" Petersen coil, but by means of an "active" residual current compensation.
2. Feeding in the static current $I_{Stat}(t)$: the active residual current compensation feeds this current into the neutral point of the three-phase transformer, for example via a power auxiliary winding of the Petersen coil.
   The static current $I_{stat}(t)$ counteracts the fault current, which reduces the active component in the fault current and, in the case of over- or undercompensation, also a reactive component, or in the optimum case even completely compensates for it.
   The infeed of the static current $I_{Stat}(t)$ can completely discharge the fault location.
   The three-phase system reacts to this compensation in such a way that the displacement voltage $U_0$ increases and the phase-ground voltage ($U_{L1e}$ for a ground fault in phase L1, $U_{L2e}$ for a ground fault in phase L2, $U_{L3e}$ for a ground fault in phase L3) of the phase affected by the ground fault decreases.

For ground faults that are located very close to the bus bar, i.e. close to the transformer and the longitudinal impedance from the bus bar to the fault location is negligible, the voltage $U_{L1e}$ (or $U_{L2e}$, $U_{L3e}$) corresponds to the voltage at the fault location.

If the voltage at the fault location, i.e. the voltage of the phase with respect to ground in the case of a unipolar ground fault, is close to 0 V in the optimum case, the fault current is also reduced to 0 A.

However, the three-phase system cannot react abruptly to the static current $I_{Stat}(t)$, as a recharging of the conductor-earth capacitances must take place.

This recharging depends on the network time constant of the network in the fault-free state, and on the ground fault resistance.

The recharging is very fast for very low-resistance ground faults, and correspondingly slower for ground faults with a higher resistance.

3. Feeding in the boost current $I_{Boost}(t)$: the active residual current compensation feeds this current into the neutral point of the three-phase transformer.

In order to accelerate the recharging process, the boost current $I_{Boost}(t)$ is fed in at the neutral point in addition to the static current $I_{Stat}(t)$.

This results in a faster reduction of the voltage $U_{L1e}$ (or $U_{L2e}$, $U_{L3e}$) and thus a correspondingly faster reduction of the voltage at the fault location.

The three-phase transformer T converts the voltages of a generator or source $U_{L1}$, $U_{L2}$, $U_{L3}$ to the network voltages $U_{L1e}$, $U_{L2e}$ and $U_{L3e}$, which are distributed via a bus bar BB for the phases L1-L3.

To model a real transformer, the internal impedances of the transformer are taken into account in the form of line resistances $R_{T1}$-$R_{T3}$ and inductances $L_{T1}$-$L_{T3}$.

For each of the network conductors of the individual phases L1-L3, an equivalent circuit diagram is shown in the form of Π-elements $\Pi_1$-$\Pi_3$ for line impedances with line inductances, line capacitances and line resistances, as well as a terminating load network RF1.

In addition, an unbalance impedance $Z_u$ is intended to represent the network unbalance, as shown in the drawing by way of example on phase L3.

A fault current $I_f$ flows through a fault resistance $R_f$.

In the fault-free network, all parameters of the simplified null equivalent circuit diagram are determined by tuning the arc suppression coil. This allows the static infeed current $I_{Stat}(t)$ to be determined for complete compensation of the fault current in the event of a ground fault in phase L1, L2 or L3.

A measurement and control device 1 is provided and designed to detect the network voltage $U_{L1e}$, $U_{L2e}$, $U_{L3e}$ and on that basis to identify a line fault $I_f$ occurring, for example by determining a fault resistance $R_f$, and to determine a control variable to compensate for the line fault.

A converter circuit 2 is also provided, which is designed to generate a control current $I_{Comp}$ from the control variable and to feed in the control current at the neutral point of the transformer T to compensate for the line fault $I_f$.

The measurement and control device 1 is also designed to determine a boost conductance $Y_{Boost}$ from which to determine a boost function, to generate a corresponding boost current $I_{Boost}$ and to feed in the boost current at the neutral point of the transformer T.

The faulty phase and the corresponding fault resistance Rf can be determined by the position of the neutral point in the three-phase medium- or high-voltage network, as is known to the person skilled in the art.

The measurement and control device 1 is designed to detect the network voltages $U_{L1e}$, $U_{L2e}$, $U_{L3e}$ with a sampling rate of, for example, 10,000 samples per second or even greater.

The converter circuit 2 is designed to generate the control variable with a sampling rate of, for example, 10,000 samples per second or even greater.

The control current $I_{Comp}$ or the boost current $I_{Boost}$ is fed in at the neutral point of the power supply network.

It is possible to limit the boost current $I_{Boost}$ by the size of the maximum current intensity that results from the performance of the electronic components used in the converter circuit.

The converter circuit 2 corresponds to a frequency converter, i.e. a converter that generates an alternating voltage or an alternating current that is variable in frequency and amplitude for the compensation, and which is fed into the neutral point of the three-phase network, as explained previously. Such converters with high temporal resolution, such as those with more than 10,000 samples per second, are known to the person skilled in the art.

The measurement and control device is used to detect a fault current on the phases L1-L3 and calculates the amplitude and phase of the required compensation current.

Such microprocessor-based measurement and control devices with high temporal resolution (10 k samples per second) are known to the person skilled in the art.

Together with the converter circuit, the measurement and control device connects the network voltage side with the network voltages $U_{L1e}$, $U_{L2e}$, $U_{L3e}$ of the transformer T to the source voltage side with the source voltages $U_{L1}$, $U_{L2}$, $U_{L3}$ by applying the corresponding compensation current, that is, the control current $I_{Comp}$ or boost current $I_{Boost}$.

A method for compensating a line fault If occurring on a three-phase power supply network can be specified accordingly.

In the method, a network voltage $U_{L1e}$, $U_{L2e}$, $U_{L3e}$ is detected, a line fault $I_f$ that occurs on this basis is detected, e.g. by determining a fault resistance $R_f$, a control variable is determined to compensate the line fault, and from the control variable a control current $I_{comp}$ is generated and fed in at the neutral point of the transformer T of the power supply network to compensate for the line fault $I_f$.

The boost conductance $Y_{Boost}$ is determined, from which a boost function is determined, a corresponding boost current $I_{Boost}$ is generated and fed in at the neutral point of the transformer T.

The boost function has a maximum of 20%, preferably 50%, particularly preferably 100% or 200% of the magnitude of the maximum of the RMS value of the control variable.

The maximum of the RMS value of the boost function occurs within a maximum of 25 ms, preferably a maximum of 20 ms, and the boost function decays to a maximum of 10% of the magnitude of the maximum of the RMS value of the control variable, that is, the static current $I_{Stat}(t)$, within a maximum of 120 ms, preferably a maximum of 35 ms.

Figure 3:
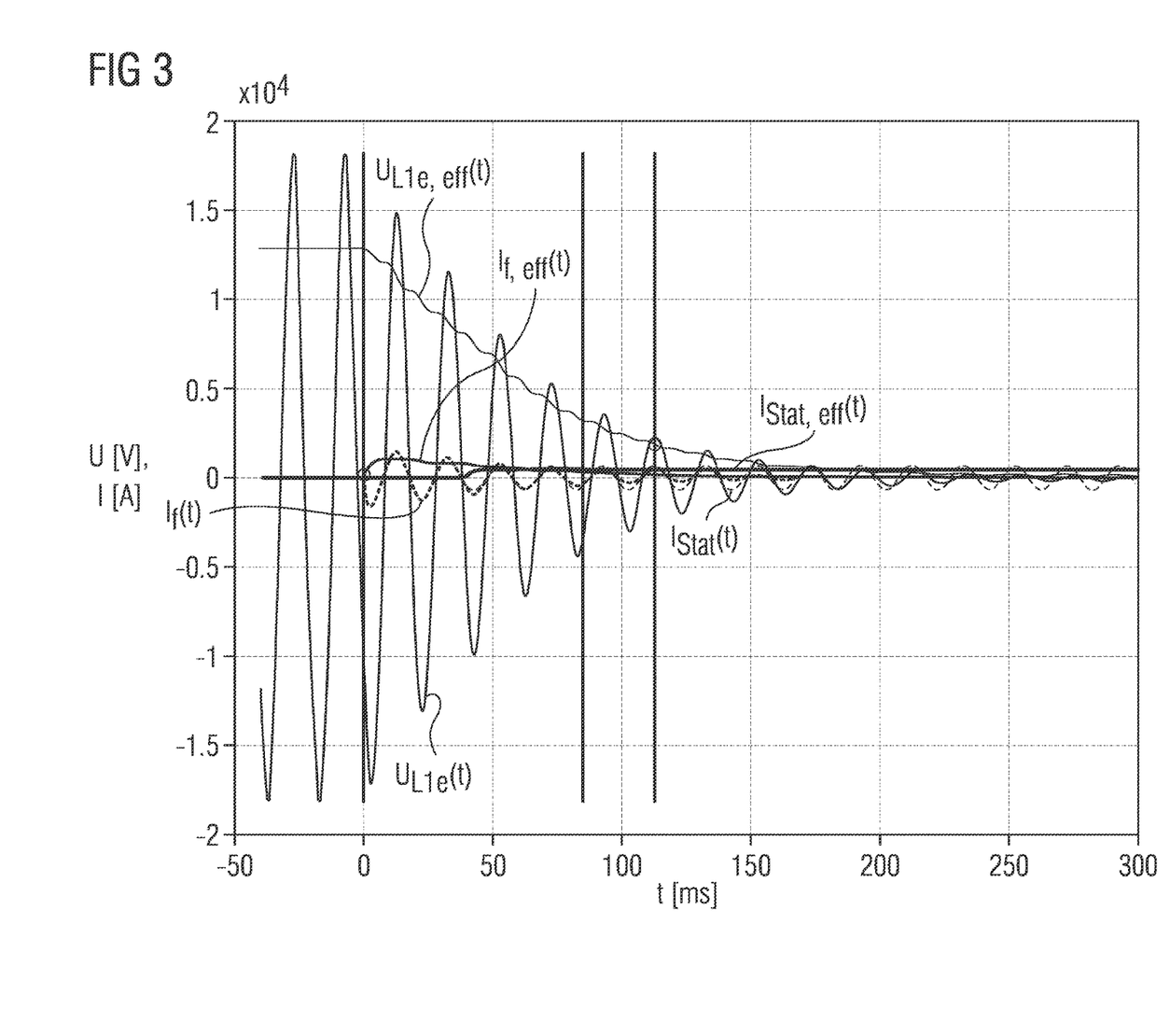
FIG. 3-5 shows examples of current and voltage waveforms without boost function.
Figure 4:
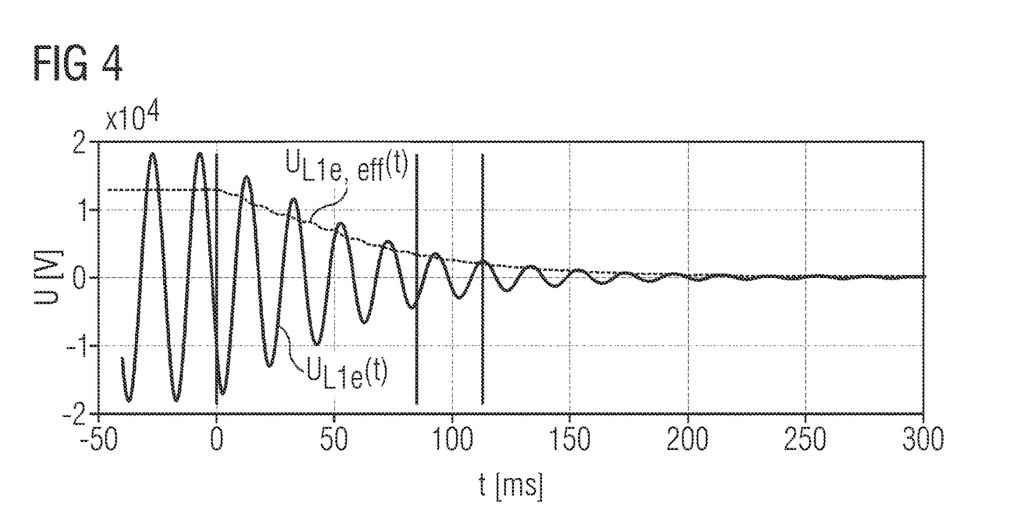
Figure 5:
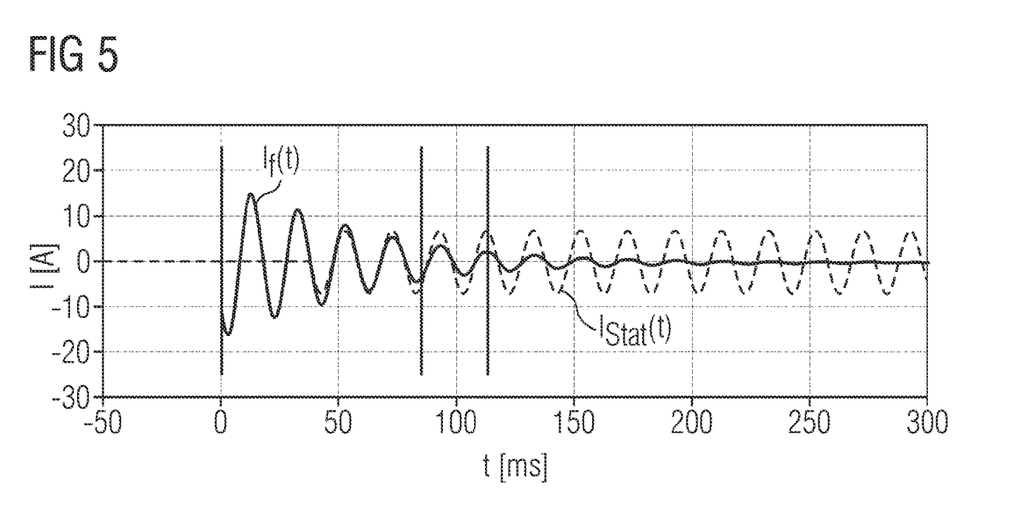

FIG. 3 to FIG. 5 show representations of currents and voltages without using the boost function.

The index "eff" is used to designate the RMS value of each variable.

FIG. 4 and FIG. 5 are enlarged representations of FIG. 3 for improved clarity.

The network voltage $U_{L1e}$ with a peak value of 18 kV and an RMS value of approximately 12,700 V can be identified.

At the time of 0 ms, the power supply network experiences a fault current $I_f$ and the network voltage $U_{L1e}$ breaks down. The figure also shows the RMS value of the fault current $I_f$ with a 100-fold scaling.

At the time of approximately 40 ms, the infeed current $I_{Stat}(t)$ is calculated and applied to determine an arc suppression coil $L_{ASC}$ in accordance with the conventional method, as is apparent from the RMS value of the infeed current $I_{eci}$ with a 100-fold scaling.

It is apparent that it takes approximately 113 ms for the voltage to drop below 1,900 V, as required by network operators.

However, the requirement is that this voltage target should be reached within 85 ms. Therefore, the compensation shown is not fast enough. Network operators define, for example, a low impedance fault (LIF) of e.g. 400 Ohms, at which the remaining phase—ground voltage of the faulty phase in a 22 kV network must have decayed below 1900V within 85 ms.

The actual network time constant is higher,
the lower the losses in the network, i.e. the higher the resistance $R_0$, and
the higher the fault resistance $R_f$ in a unipolar ground fault, and
the greater the capacitive current of the network.

By supplying the "static" compensation current $I_{Stat}(t)$, the fault current $I_f$ can be reduced to 0 A.

In this example, it is assumed that the compensation current is only fed in after 40 ms.

Figure 7:
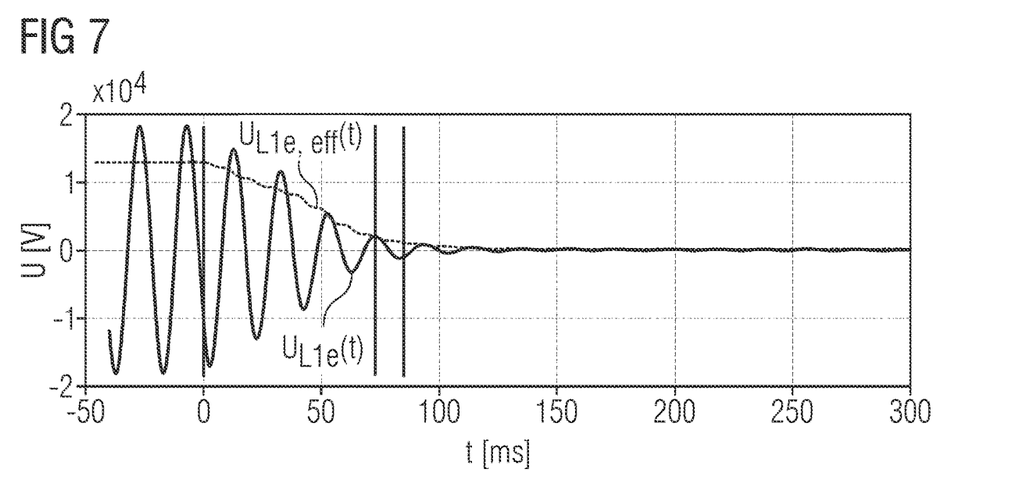
Figure 8:
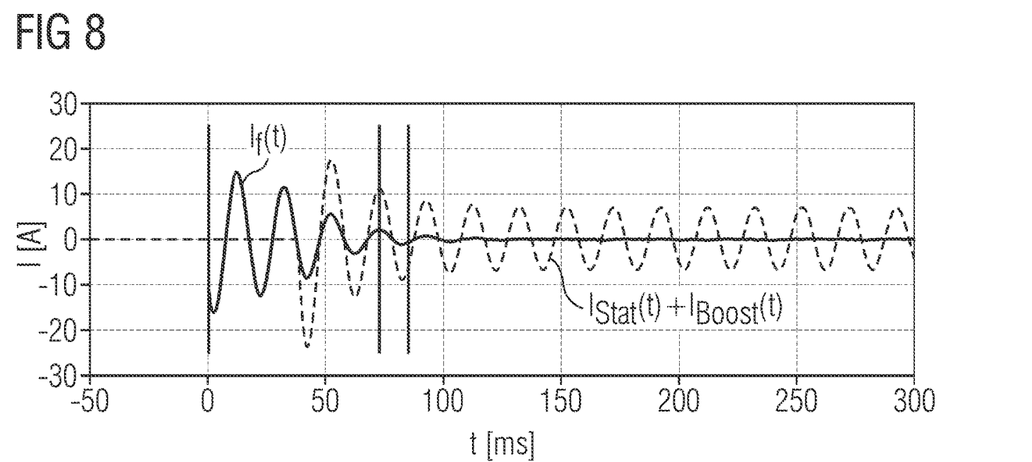

FIG. 6 to FIG. 8 show representations of currents and voltages using the boost function.

FIG. 7 and FIG. 8 are enlarged representations of FIG. 6 for improved clarity.

By temporarily increasing the infeed current, i.e. by means of the boost function, the voltage $U_{L1e}$, and thus the voltage at the fault location, is reduced more quickly.

It is apparent that the infeed current $I_{Comp}(t)$ is greater than the pure static current $I_{Stat}(t)$, and then subsequently decreases, referenced to the RMS value in each case.

In other words, the boost current $I_{Boost}(t)$ drops to zero because the voltage $U_{L1e}$ also reduces to zero, and the infeed current $I_{Stat}(t)$ remains. The description is also the same as for the previous figure.

However, the waveform of the infeed current $I_{Stat}(t)$ is increased by the boost function $I_{Boost}(t)$, so that a faster compensation of the fault is achieved.

It can therefore be seen that after only 73 ms the voltage $U_{L1}$ has dropped so quickly below the voltage of 1900 V that the above-mentioned requirements can be met by network operators.

Figure 9:
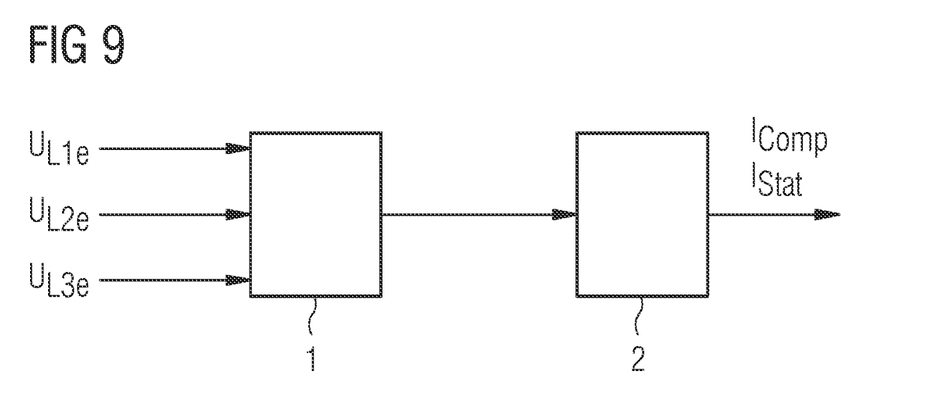
FIG. 9 shows an example of a block circuit diagram for generating a compensation or infeed current.

FIG. 9 shows a block diagram of a circuit for generating the compensation or infeed current $I_{Stat}(t)$ and/or $I_{Boost}(t)$, based on FIG. 2 with the network voltages $U_{L1e}$, $U_{L2e}$, $U_{L3e}$, wherein in this example the phase L1 has a low-resistance ground fault.

With such an arrangement, the compensation or infeed current $I_{Stat}(t)$ and/or $I_{Boost}(t)$ can also be generated according to FIG. 1.

LIST OF REFERENCE SIGNS

1 measurement and control device
2 converter
BB bus bar
C grid capacity
$E_f$ driving fault voltage
$E_U$ driving unbalance voltage
$I_{ASC}$ current through the arc suppression coil impedance
$I_d$ damping current
$I_{comp}$ infeed current
$I_f$ current through the fault location
$I_{01}$ zero current for output circuit 1
$I_{pos}$ coil position
$I_{res}$ resonance point of the network
$I_u$ unbalance current
L1, L2, L3 phase
$L_{ASC}$ inductivity of the arc suppression coil (ASC)
LT1, LT2, LT3,
$R_{T1}$, $R_{T2}$, $R_{T3}$ internal impedance of the transformer
Π1, Π2, Π3 Π-elements as phase-internal impedance of the transformer
$R_0$ equivalent resistance
$R_{ASC}$ equivalent resistance of the arc suppression coil
$R_f$ fault resistance, ground fault resistance
T transformer
$U_0$ displacement voltage, zero voltage
$U_{L1}$, $U_{L2}$, $U_{L3}$ generator voltage of phase to ground
$U_{L1e}$, $U_{L2e}$, $U_{L3e}$ network voltage of phase to ground
$Z_u$ impedance unbalance

The invention claimed is:

1. A device for compensating a line fault occurring on a three-phase power supply grid, the device comprising:
a transformer having a neutral point, said transformer being configured to generate a network voltage and thus a neutral-point displacement voltage;
a measurement and control device configured to detect the network voltage or the neutral-point displacement voltage and, based thereon, to identify an occurring line fault and to determine a control variable to compensate for the line fault; and
a converter circuit configured to generate a control current from the control variable and to feed in the control current at the neutral point of said transformer to compensate for the line fault; and
said measurement and control device being further configured to determine a boost conductance from which to determine a boost function, to generate a corresponding boost current and to feed in the boost current at the neutral point of said transformer.

2. The device according to claim 1, wherein the boost function has a maximum of 20% of a magnitude of a maximum of an RMS value of the control variable.

3. The device according to claim 2, wherein the boost function has a maximum of 50% of the magnitude of the maximum of the RMS value of the control variable.

4. The device according to claim 2, wherein the boost function has a maximum of 50% of the magnitude of the maximum of the RMS value of the control variable.

5. The device according to claim 2, wherein the boost function has a maximum of 100% of the magnitude of the maximum of the RMS value of the control variable.

6. The device according to claim 1, wherein the boost function has a maximum of 200% of a magnitude of a maximum of an RMS value of the control variable.

7. The device according to claim 1, wherein a maximum of an RMS value of the boost function occurs within a maximum of 25 ms and the boost function decays to a maximum of 10% of a magnitude of a maximum of an RMS value of the control variable within a maximum of 120 ms.

8. The device according to claim 7 wherein the maximum of the RMS value of the boost function occurs within a maximum of 20 ms and the boost function decays to a maximum of 10% of the magnitude of the maximum of the RMS value of the control variable within a maximum of 35 ms.

9. A method for compensating a line fault occurring on a three-phase power supply grid, the method comprising:
  detecting a network voltage or a neutral-point displacement voltage and, based thereon, detecting a line fault;
  determining a control variable to compensate for the line fault, generating a control current from the control variable, and feeding the control current into a neutral point of the transformer of the power supply grid to compensate for the line fault; and
  determining a boost conductance and deriving a boost function therefrom, generating a corresponding boost current, and feeding the boost current into the neutral point of the transformer.

10. The method according to claim 9, wherein the boost function has a maximum of 20% of a magnitude of a maximum of an RMS value of the control variable.

11. The method according to claim 10, wherein the boost function has a maximum of 50% of the magnitude of the maximum of the RMS value of the control variable.

12. The method according to claim 10, wherein the boost function has a maximum of 100% of the magnitude of the maximum of the RMS value of the control variable.

13. The method according to claim 10, wherein the boost function has a maximum of 200% of the magnitude of the maximum of the RMS value of the control variable.

14. The method according to claim 9, wherein a maximum of an RMS value of the boost function occurs within a maximum of 25 ms and the boost function decays to a maximum of 10% of a magnitude of a maximum of an RMS value of the control variable within a maximum of 120 ms.

15. The method according to claim 14, wherein the maximum of the RMS value of the boost function occurs within a maximum of 20 ms and the boost function decays to a maximum of 10% of the magnitude of the maximum of the RMS value of the control variable within a maximum of 35 ms.

* * * * *